United States Patent [19]

Trease

[11] 3,891,450

[45] June 24, 1975

[54] SOLVENTS AND VEHICLES FOR MICRO-CIRCUITRY PASTES AND PASTES MADE THEREFROM

[75] Inventor: Ralph E. Trease, Toledo, Ohio

[73] Assignee: Owens-Illinois, Inc., Toledo, Ohio

[22] Filed: Apr. 2, 1973

[21] Appl. No.: 347,311

Related U.S. Application Data

[63] Continuation of Ser. No. 159,452, July 2, 1971, abandoned.

[52] U.S. Cl. .................. 106/26; 106/188; 106/189; 106/197 R; 106/311; 117/160; 117/166; 117/227; 252/514; 252/518

[51] Int. Cl.. C08h 17/34; C08h 17/66; C09d 11/14

[58] Field of Search ............................ 106/1, 19–32, 106/48, 188, 189, 39, 197, 311; 117/125, 227, 160, 166; 148/26; 252/62.1, 514

[56] References Cited

UNITED STATES PATENTS

| | | | |
|---|---|---|---|
| 2,610,126 | 9/1952 | Kerridge et al. | 106/26 |
| 2,682,480 | 6/1954 | Andrews | 117/38 |
| 2,942,994 | 6/1960 | Procll et al. | 106/188 |
| 3,089,782 | 5/1963 | Bush et al. | 106/26 |
| 3,396,044 | 8/1968 | Satterfield | 106/48 X |
| 3,414,417 | 12/1968 | Miller et al. | 106/172 X |
| 3,446,764 | 5/1969 | Phillips et al. | 106/311 X |
| 3,537,892 | 11/1970 | Milkovich et al. | 106/1 X |

FOREIGN PATENTS OR APPLICATIONS

| | | | |
|---|---|---|---|
| 929,417 | 6/1963 | United Kingdom | 106/311 |

OTHER PUBLICATIONS

Kirk–Othmer, Encyclopedia of Chemical Technology, 2nd Ed., Vol. 4, (pp. 656–661 and 681–682 relied on) TP E68.C.

Ibid, Vol. 10, pp. 647–659 relied on.

*Primary Examiner*—Joan E. Welcome
*Attorney, Agent, or Firm*—Richard B. Dence; E. J. Holler

[57] ABSTRACT

Provided are liquid solvents and carrier vehicles for microelectronic printing pastes. The liquid solvents are comprised of a volatile, organic liquid having at least two hydroxy groups pendent from its carbon chain, often admixed with a volatile organic liquid diluent in an amount sufficient to reduce the rest viscosity and pseudo-plasticity of the resulting printing paste. The carrier vehicles formed from such solvents are a solution of the solvent and an organic binder which are then admixed with particles of a glass binder and an electronically effective material to form a printing paste.

10 Claims, No Drawings

SOLVENTS AND VEHICLES FOR MICRO-CIRCUITRY PASTES AND PASTES MADE THEREFROM

This is a continuation of Ser. No. 159,452, filed July 2, 1971, now abandoned.

This invention relates to organic solvents and carrier vehicles for printing pastes and pastes made therefrom. More specifically, this invention relates to unique organic solvents and carrier vehicles made therefrom for pattern printing of conductor, resistor and dielectric pastes wherein the patterns are easily printed and have exceptionally good resolution.

With the advent of integrated microelectronic circuitry and its importance to the electronics industry generally, great attention has been focused upon the need for pattern printing of the various electronic components and arrays within the printed circuit. Generally speaking, printed arrays in patterned microelectronic printed circuitry are about 2–50 mils in width and approximately 0.3–1.0 mil in thickness. Furthermore, where a multitude of lines or other patterns must be presented, the spacing between laterally opposed lines or patterns may often be as close as about 2–10 mils. Because of the close spacing of these patterns, as well as for practical electrical considerations, it is generally of paramount importance that high resolution of each pattern be effected during the printing process and that any tendency to flow laterally after printing be held to an absolute minimum in order to maintain the necessary spacing between adjacent patterns or for other electrical or mechanical reasons.

Pattern printing for microcircuitry or other purposes is well-known and generally is effected by the use of a mesh screen or mask which provides a pattern of the desired design and width. The electronically effective material such as conductor, resistor, or dielectric is generally applied to the screen or mask in paste form comprising particles of the said material dispersed in an organic liquid vehicle. By means of pressure from above the screen such as by a reciprocating rubber roller, squeegee or the like, the paste is forced through the patterned openings in the screen and printed on a substrate. Drying and firing after printing to remove the vehicle and coalesce the particles of said material results in a patterned structure being formed.

The art has had a measure of success in obtaining acceptable resolution and in limiting the lateral flow of printed patterns after they are screen printed upon a substrate by formulating printing pastes of sufficiently high viscosity such that after printing, the lines will maintain, within tolerable limits, their original dimensions. Such viscosity is generally provided within the paste by adding a thickening agent thereto.

Unfortunately, the high viscosity necessary to ensure dimensional stability in prior-art pastes has attendant therewith the major drawback of adversely affecting the printability of the paste. In some instances, the viscosity is so high that it actually results in a paste which does not freely remove itself from the screen or smooth itself after screen removal, thus resulting in the image of the screen or mask being left in the upper surface of the pattern. Such an image can materially affect the electronic properties of the ultimately formed structure after firing. Furthermore, the use of such high viscosities may be extremely detrimental to the ability to move the paste through the screen or mask since undue force may be required to the detriment of the substrate upon which the line is printed. Undue force of this nature also affects the reproducibility of the pattern. In addition to these problems, high viscosities usually cause inherent tackiness. Such tackiness causes excessive drag on the squeegee as it traverses the screen or mask surface. Two objectionable effects occur. Firstly, the screen surface is not cleaned sufficiently by the squeegee and secondly, the glue-like paste behaves to keep the screen from lifting quickly behind the squeegee. Tackiness can also cause incomplete transfer of the material to the substrate.

In an attempt to overcome the problems attendant with the use of high viscosity, the art has attempted to balance such problems by finding an optimum viscosity for a given system. In achieving such optimization, some degree of pattern resolution must be sacrificed in order to obtain a paste which is acceptably printable through a screen or mask while at the same time, some degree of ease of printing through a screen or mask must be sacrificed in order to obtain acceptable pattern stability and resolution.

It is clear from the above discussion that there exists a definite need in the art for a printing paste which will provide on the one hand a high degree of pattern resolution and stability, especially for microelectronic circuitry, and on the other hand will be particularly easy to print without the need for undue force and with a high degree of reproducibility.

One valuable and excellent solution in fulfillment of the above-described need in the art, particularly with respect to fine-line microelectronic circuitry, is described in commonly owned copending application, Ser. No. 40,359, filed May 25, 1970, and which since issued on Aug. 20, 1974 as U.S. Pat. No. 3,830,651. The disclosure of this copending application is incorporated herein by reference.

Generally speaking, the aforementioned copending application overcomes the problems attendant the prior art by employing in a printing paste a carrier vehicle which comprises an organic liquid admixed with a thixotrope and optionally a binder and/or a gelling agent. The thixotrope is present in an amount sufficient (1) to render the paste easily printable, usually characterized by a screen viscosity index of about 60–1,000, and (2) to provide the paste after screen printing with a sufficient recovery time, usually on the order of about one second or less, and a sufficient viscosity after recovery, usually about $2.5 \times 10^6$ centipoise at 25° C., to maintain thin line resolution. The paste is formulated by admixing the carrier vehicle with the desired amount of particulate conductor, resistor, or dielectric material.

Through the approach described in the aforementioned U.S. Pat. No. 3,830,651, then, a significant and valuable step forward in the art has been taken. While this significant step forward still remains valuable for a wide variety of uses, particularly in fine line (2–5 mil widths) printing, a few problems in certain specialized areas of the microelectronic circuitry art have unexpectedly arisen with this technique. For example, the preferred thixotropes, where solderability of the ultimate pattern is necessary, are usually those of the organic type. While the use of organic (eventually removed) thixotropes generally presents no problem, in certain specialized instances drying of the printed pastes must take place at high temperatures over relatively long periods of time. In these instances the more preferred organic thixotropes such as THIXCIN (a solidified hydrogenated castor oil having a particle size of less than about 50 microns), tend to "liquefy," thus resulting in slumping of the pattern and some loss of resolution. As another example, it has been found that when printing wide patterns (greater than about 5 mils) through conventional screen provided with resin emulsions to define the desired pattern, the pastes provided with organic thixotropes tend to adhere to the resin emulsion as they pass through the printing screen. Such a problem, known as "screen hang-up," affects the ability to get high reproducibility of pattern width. As a further example, relatively high recovery viscosities are often necessary to build into the system in those situations where exceptionally good line resolution is required. Such relatively high recovery viscosities inherently present some tackiness, thus allowing the upper surface of the pattern to retain marring caused by the screen movement during printing. While such marring is usually tolerable, in certain specialized instances, such as when conductivity must be maintained within very narrow limits, it is undesirable.

It is therefore apparent from the above that there exists a need in the art for a technique alternative to that of the copending application which is not only generally useful in microelectronic printing, but also eliminates the problems attendant those specialized areas described above. In this respect, then, there is a need for a technique which may not necessarily be as good or better than the technique of the aforementioned copending application, in non-problem areas, but which is better than said technique in the problem areas because it mitigates or eliminates the described problems. It is a purpose of this invention to fulfill these needs in the art.

Generally speaking, this invention fulfills these needs in the art by providing a unique liquid solvent system from which unique carrier vehicles and printing pastes can be formulated. Such liquid solvent systems as contemplated by this invention comprise a volatile organic liquid having at least two hydroxy groups pendant from its carbon chain in an amount to render the ultimate paste formed pseudo-plastic. When such solvent systems have dissolved therein an organic binder, they constitute the carrier vehicles of this invention.

The term "volatile" is used herein to denote an organic liquid capable of evaporating from the printed paste during a conventional drying step. Such a step usually comprises drying the printed paste for about 5–60 minutes at an elevated temperature of about 100°–150° C.

The term "pseudo-plastic" is often used interchangeably with the term "thixotropic." However, current scientific thought recognizes a distinction in that while both materials experience a reduction in viscosity when subjected to a shear force and both recover when shear is ceased, the truly thixotropic material is thought of as time dependent while the "pseudo-plastic" material is thought of as changing viscosity much more rapidly (i.e., almost instantaneously). Thus, while the two terms are often correctly interchangeable when used in their broader sense, for the purposes of this invention, and its distinction over the aforementioned copending application, the term "pseudo-plastic" is used herein to denote a system where no overt solid thixotropic agent is added, but which rapidly experiences a significant reduction in viscosity when subjected to a shear force.

While not wishing to be limited to any particular theory, it is believed that the presence of hydroxy groups in the liquid solvent of the pastes of this invention, interrelate with the other ingredients of the paste to form a pseudo-plastic material. It is also believed that because of this "pseudo-plastic" characteristic, lower rest viscosities than heretofore thought tolerable in a printing paste for good line resolution may be employed. In this respect, and regardless of what actually effects the result, it is known that for the preferred systems contemplated by this invention, the rest viscosity of the pastes of this invention can usually be below those normally thought to be the lower limit for good pattern resolution. Such a lower limit is generally considered to be about 3,000,000 centipoise at 25° C. This invention, quite unexpectedly and in most instances contemplated, can tolerate rest viscosities as low as about 780,000 centipoises at 25° C. and still maintain very acceptable line resolution. In addition, and as a byproduct of this ability to use such low viscosities, there is built within the system the ability of the upper surface of the preferred printed pastes of this invention to flow very slightly after printing, thus to reduce and usually totally eliminate marring caused by the printing screen or mask. The flow, however, does not occur slowly enough (i.e., recovery is fast enough because the material is a true "pseudo-plastic") or to a significant degree to substantially affect line or pattern resolution. As an additional by-product, because no inorganic "glassy" thixotropic agent is employed, good solderability of the ultimate pattern can be achieved. As a still further byproduct, and because of the highly cohesive nature of the pastes of this invention, the pastes generally have little affinity for the conventional resin emulsions used on some printing screens, thus reducing or eliminating the problem of "screen hang-up."

As stated hereinabove, the volatile organic liquid solvent useful in the solvent systems of this invention may be any volatile organic liquid compound having at least two hydroxy groups pending from its carbon chain, capable of dissolving an organic binder therein and capable of rendering the paste pseudoplastic. Preferably, the solvent is sufficiently volatile to substantially totally evaporate from the paste during a drying period of about 15 minutes at 125° C.

Examples of such solvents are the various substituted and unsubstituted polyols. Preferably, such polyols are straight chain polyols having 2–10 carbon atoms or a polymer having repeating monomer units of said 2–10 carbon atoms. Most preferably, and to fulfill the necessary characteristic of being volatile, they should have a boiling point of between about 250°–300° C.

Specific examples of liquid solvents useful in this invention include ethylene glycol, diethylene glycol, triethylene glycol, tetraethylene glycol, polyethylene glycol, propylene glycol, dipropylene glycol, tripropylene glycol, polypropylene glycol, glycerine and its derivatives, hexylene glycol, 1, 5 pentanediol, 2-methyl-2-ethyl-1,3-propanediol, 2-ethyl-1,3-hexanediol, 1, 2, 6-hexanetriol, thiodiglycol and 1,3 butylene glycol. Of these, polypropylene glycol is preferred, being most preferred with a molecular weight less than about 500.

The organic binder dissolved in the solvent systems of this invention to thereby form the carrier vehicles of this invention add "green-strength" to maintain line resolution after drying (i.e., removal of the volatile organic liquid) of the printed paste. Any well-known organic binder heretofore useful in printing pastes may be employed. Examples of which include ethyl cellulose, hydroxy methyl cellulose, acrylates, polyoxyethylenes, natural gums, synthetic resins, and the like. A particularly preferred binding agent contemplated by this invention is ethyl cellulose which preferably, and by conventional nomenclature, has a chain length (i.e., viscosity indication of chain length) of N-4 to N-200.

While the volatile liquid organic compound may be employed alone as the only liquid in the solvent systems of this invention, it has been found helpful to employ an additional diluent volatile organic liquid miscible in said volatile organic compound which does not detrimentally affect the ability of the binder to be dissolved in the system and which is capable of reducing the rest viscosity and pseudo-plasticity of the paste. In this respect, it has been found that with some of the volatile liquid compounds, the inherent rest viscosity of the paste is, while most often tolerable, not sufficiently low to eliminate marring. In addition, it has also been found with many liquid compounds that their pseudo-plasticity or reaction to shear is so swift and large that the paste on top of the screen tends to "liquefy" from the numerous shear actions of the roller or squeegee employed as it makes multiple passes over the paste to form a series of products therefrom. By the addition of a diluent, then, the effect of shear is reduced, thus eliminating or, at least, mitigating the problem of "liquification."

Examples of such volatile liquid organic diluents useful in this invention include any of the well-known liquids normally employed as organic liquid vehicles for printing pastes which have the above-described characteristics and abilities. Such examples include butyl carbitol acetate (diethylene glycol monobutyl ether acetate), diethyl phthalate, iso-amyl salicylate, the higher boiling paraffins, cycloparaffins, aromatic hydrocarbons and the mono and di-alkyl ethers of diethylene glycol or their derivatives (e.g., diethylene glycol hexyl ether). A particularly preferred diluent for the purposes of this invention is butyl carbitol acetate.

While the amount of diluent employed in the liquid solvent systems of this invention will vary widely depending upon the other variables in the system and the results desired, it has been found for most purposes that the diluent can be employed in an amount of about 0–98% by weight of the system while the volatile liquid compound may be employed in an amount of about 2–100% by weight of the system.

The amount of diluent, as stated, is generally determined by its ability to reduce rest viscosity and pseudo-plasticity. Thus, the choice of a specific amount of diluent within the above broad range will generally revolve about these two criteria. For many systems, such as a conductor paste of the Pd-Ag type wherein the pattern is to be of about 5–10 mils in width and printed through a conventional resin emulsion screen at normal squeegee rates of about 6 inches per second, the diluent is added in an amount such that the rest viscosity is less than about 3,000,000 centipoises at 25° C. but greater than about 780,000 centipoises at 25° C. For most systems, especially when using the above-described preferred polyols as the liquid compound, such will also inherently provide the requisite decrease in pseudo-plasticity characteristics.

The carrier vehicles formed from the liquid solvent systems of this invention will also vary widely in the amount of ingredients depending upon the various results to be achieved, systems to be employed etc. Generally speaking, however, the carrier vehicles usually contemplated by this invention comprise by weight percent about 99–70% solvent system and 1–30% organic binder dissolved therein, preferably about 90–80% solvent system and 10–20% organic binder and most preferably about 85% solvent system and 15% organic binder.

The carrier vehicles of this invention are readily formulated into printing pastes useful in a wide variety of arts but most particularly in the microelectronic circuitry art. Such pastes generally include the vehicle, a particulate glass binder material, and an electronically effective particulate material. The amounts and particle sizes of the ingredients play a practical role in achieving workable products as described. Thus, in accordance with known skill in the art, these amounts and particle sizes will be varied to meet the various situations in which the pastes are employed.

Generally speaking, for most purposes contemplated by this invention, the solids content of the paste, which includes the electronically effective material and the glass binder material accounts for, by weight, about 65–95%, preferably 72–76% and most preferably about 74% of the paste. The carrier vehicle then accounts for by weight about 35–10%, preferably 28–24% and most preferably about 26% of the paste. The average particle size of the solids should generally be between about 10–0.3 microns. While some variance is tolerable, too large a particle size affects electronic and cosmetic properties while too small a size tends to deteriorate the fired film density.

While the weight percentages of the glass binder material and electronically effective material may vary over a wide range, for most purposes contemplated, the solids are comprised of by weight about 90–80% of the electronically effective material and 10–20% glass binder material. Preferably, such as in conductor systems employing silver as at least part of the electronically effective material the solids comprise by weight about 85–80% electronically effective material and 15–20% glassy binder, and most preferably about 82% and 18% respectively.

The electronically effective material can be any one of the well-known materials currently employed in the art such as a dielectric, resistor, or conductor. Particularly preferred for the purposes of this invention, in that it brings the uniqueness of this invention to bear upon particular problems in a special art, is the conductor system wherein silver is employed preferably, in a weight ratio with palladium of Ag:Pd = 0.5:1 to 4:1. Most preferably the system is an Ag:Pd system wherein the weight ratio of Ag:Pd is about 1.9:1.

Any conventional glass binder material can be employed. This material may include a glass composition employed alone or employed with $Bi_2O_3$ in particulate form. Preferred glass binders for the purposes of this invention include particles of a lead borosilicate glass alone or preferably admixed with $Bi_2O_3$ in a preferred weight ratio of about 75% glass, 25% particulate $Bi_2O_3$. The average particle sizes of $Bi_2O_3$ are substantially the same as those of the other particulate solids hereinabove described. A particularly preferred glass binder for the purposes of this invention is lead borosilicate glass composition B as set forth in footnote 1 of Table B of this disclosure.

The pastes of this invention are readily formed by thoroughly admixing the above indicated ingredients usually by roller or ball milling them until a substantially homogeneous paste is formed. The pastes thus formed may be printed into any desired pattern in accordance with any well-known and conventional technique. For the purposes of pattern printing for microelectronic circuitry a preferred technique is to screen print the pattern upon the desired substate using a screen (usually employing a conventional emulsion resin to outline and define the pattern) having a screen mesh size of about 165 or 200 to about 400 and a reciprocating squeegee set to reciprocate at a speed of about 2–50 inches per second. Single or multiple coat techniques may be employed. The pattern so printed is air, infrared or oven dried upon the substrate. Such a drying procedure may usually be effected more rapidly and at higher temperatures, if necessary or desired, than at those times and temperatures indicated in the aforementioned U.S. Pat. No. 3,830,651, since slumping does not become a problem.

After the paste is dried, it is heated to its firing temperature (e.g. for the above-described preferred system about 600°–950°C.) and held at peak for about 5–15 minutes with 5–25 minute heat up and cool down periods. The resulting patterns exhibit high resolution, reproducibility and usually have no marring visible in their upper surface.

The following examples illustrate rather than limit the above discussion.

EXAMPLES

Liquid vehicles were formulated by admixing the indicated liquid solvent with the indicated organic binder such that the binder comprised the indicated weight percent of the vehicle. The liquid vehicles were then admixed with a particulate solids component in a weight percent of 74% solids, 26% vehicle. This was accomplished by first admixing the vehicle with particles of silver metal and glass binder (including $Bi_2O_3$ where employed) having an average particle size of about 1 micron and 3 roll milling the admixture. To this admixture was then added, with additional 3 roll milling, particles of palladium metal. The various amounts and particle sizes are indicated in Table B. The weight ratio of Ag:Pd was about 1.9:1. The thus formulated paste then was screen printed using standard printing techniques by employing an AMI-24 Screen Printer provided with a 200 mesh screen with a 1 mil resin emulsion build up and a squeegee rate of 6 inches per second. The screen pattern was a burst pattern design wherein some lines were 6 mils in width and some were 10 mils. An alumina ceramic substrate was employed. The test pattern was then dried in an oven at 125°C. for about 15 minutes, then fired at 760°C. for 10 minutes at peak with 20 minute heat-up and cool down periods. The samples were visually inspected before and after drying and firing for the various reported characteristics which are evaluated in Table A as follows:

TABLE A

| Ex. | Viscosity (1) 1 rpm | Viscosity (2) 10 rpm | (3) ratio | Solvent | Vehicle % E. C. | Drying |
|---|---|---|---|---|---|---|
| 1 | 3,550,000 | 390,000 | | BCA (4) | 5.4 N-200 3.1 Thixcin | Fast |
| 2 | 3,800,000 | 512,500 | 7.4 | BCA | 7% N-50 | Fast |
| 3 | 775,000 | 375,000 | | BCA | 12½% N-4 | Med. |
| 4 | 3,800,000 | 487,500 | | Ethoxy triglycol | 12½% N-4 | Med. |
| 5 | 2,250,000 | 342,500 | 6.6 | P-400 (7) | 10 N-4 | Very Slow |
| 6 | 2,800,000 | 445,000 | 6.3 | P-400/BCA (2/1) (8) | 12½% N-4 | Very Slow |
| 7 | 3,500,000 | 590,000 | 6.0 | P-400/Dep (2/1) | 12½% N-4 | Very Slow |
| 8 | 2,100,000 | 415,000 | 5.1 | P-400/BCA (2/1) | 13 N-4 | Very Slow |
| 9 | 1,200,000 | 357,500 | 3.3 | P-400/BCA (1/1) | 15 N-4 | Very Slow |
| 10 | 2,425,000 | 385,000 | 6.3 | P-200 | 12 N-4 | Slow |
| 11 | 800,000 | 172,500 | 4.6 | P-200/BCA (1/1) | 15 N-4 | Slow |
| 12 | 1,725,000 | 392,500 | 4.7 | P-400/BCA (2/1) | 13 N-4 | Very Slow |
| 13 | 900,000 | 182,500 | 4.9 | P-400/BCA (1/1) | 13 N-4 | Very Slow |
| 14 | 575,000 | 325,000 | 1.8 | DEP (6) | 10 N-4 | Slow |
| 15 | 1,050,000 | 497,500 | 2.11 | Hexyl-carbitol (5) | 25 N-4 | Very Slow |

| Ex. | Shelf Life Stability | Printing Resolution | Screen Hang-Up | Resolution Deteriation | Smell | Fired Structure | Spread in Drying |
|---|---|---|---|---|---|---|---|
| 1 | Good | OK | Excessive | — | OK | OK | OK |
| 2 | Good | Marginal | Excessive | — | | | |
| 3 | Good | Unacceptable | — | — | OK | OK | OK |
| 4 | Poor | Good | Small | — | OK | OK | OK |
| 5 | Good | Good | None | Good | Good | Pot Holes | None |
| 6 | Good | V. Good | None | Good | Good | Good | None |
| 7 | Fair | Good | None | Poor | Good | Some Pot Holes | None |
| 8 | Excellent | Excellent | Excellent | Excellent | Good | Good | None |
| 9 | Excellent | Excellent | Excellent | Excellent | Good | Good | None |
| 10 | Good | — | — | — | — | — | — |
| 11 | Good | Good | Good | Good | OK | OK | None |

TABLE A -Continued

| Ex | Shelf Life Stability | Printing Resolution | Screen Hang-Up | Resolution Deteriation | Smell | Fired Structure | Spread in Drying |
|---|---|---|---|---|---|---|---|
| 12 | Excellent | Excellent | Excellent | Excellent | Good | Good | None |
| 13 | Excellent | Good | Good | Good | Good | Good | None |
| 14 | Fair | Poor | OK | Poor | — | — | — |
| 15 | Poor | Fair | OK | OK | Bad | OK | OK |

Footnotes to Table A
(1) approximates rest viscosity at 25°C in centipoise
(2) approximates a point somewhere along the shear curve during printing thus indicating if psuedo-plasticity is present
(3) indicates degree of pseudo-plasticity
(4) BCA = butyl carbitol acetate
(5) diethylene glycol hexyl ether
(6) diethyl phthalate
(7) polypropylene glycol (P-400 indicates avg. Mol. wt.)
(8) indicates wt. ratio

TABLE B

| Ex. | Pd Particle Size (microns) | Glass Binder (wt. %) (1) | % Glass binder of solids |
|---|---|---|---|
| 1 | 1.2 | 67% $Bi_2O_3$ 33% A | 15 |
| 2 | 1.2/.109 (2) (2:1) | B | 12.4 |
| 3 | 1.2 | 50% $Bi_2O_3$ 50% C | 14.5 |
| 4 | 0.8 | C | 13.2 |
| 5 | 0.8 | C | 16.8 |
| 6 | 0.8 | C | 16.8 |
| 7 | 0.8 | C | 16.8 |
| 8 | 0.8 | 25% $Bi_2O_3$ 75% C | 17.84 |
| 9 | 0.8 | 25% $Bi_2O_3$ 75% C | 17.84 |
| 10 | 0.8 | 25% $Bi_2O_3$ 75% B | 15.2 |
| 11 | 0.8 | 25% $Bi_2O_3$ 75% B | 15.2 |
| 12 | 1.4 | 16% $Bi_2O_3$ 84% C | 21.44 |
| 13 | 0.8 | 40% $Bi_2O_3$ 60% D | 22.0 |
| 14 | 0.8 | C | 16.8 |
| 15 | 0.8 | C | 16.8 |

(1) glass binders (wt)A 60% PbO; 16% $B_2O_3$; 17.6% $SiO_2$; 3.1 $Al_2O_3$ ; 5.9% CdO B 71.5% PbO; 9.5 $B_2O_3$; 2.5% $SiO_2$; 15 ZnO; 0.5 CaO; 0.5 BaO; 0.5 SnO
C 79.9% PbO; 8.6 $B_2O_3$; 1.84% $SiO_2$; 8.63% ZnO; 1.02 BaO
D 82% PbO; 12,8% $B_2O_3$; 1.0 $SiO_2$; 4.24 BaO
(2) blend of indicated particle sizes in ( ) weight ratio Once given the above disclosure many other features, modifications, and improvements will become apparent to those skilled in the art. Such other features, modifications, and improvements are therefore considered to be a part of this invention, the scope of which is determined by the following claims.

I claim:

1. A printing paste comprising by weight:

a. about 26% of a liquid carrier vehicle consisting essentially of a liquid solvent system consisting essentially of polypropylene glycol and butyl carbitol acetate and ethyl cellulose dissolved therein; and b. about 74% of a particulate solids component consisting essentially of a glass binder consisting of about 75% by weight of a lead-borosilicate glass and about 25% by weight $Bi_2O_3$ and a conductor material comprised of Ag, said solids component consisting essentially of by weight about 82% of said conductor material and about 18% of said glass binder.

2. A liquid carrier vehicle for use in a microelectronic printing paste said vehicle consisting of about 99 – 70 weight percent of a volatile organic liquid solvent selected from the group consisting of ethylene glycol, diethylene glycol, triethylene glycol, tetraethylene glycol, propylene glycol, polypropylene glycol having an average molecular weight less than about 500, glycerin, hexylene glycol, 1, 5-pentanediol, 2-methyl-2-ethyl-1,3-propanediol, 2-ethyl-1,3-hexanediol, 1,2,6-hexanetriol, thiodiglycol and 1,3-butylene glycol; about 1–30 weight percent of an organic binder selected from the group consisting of N-4 to N-200 ethyl cellulose; and about 0 – 98 weight percent of a volatile organic diluent selected from the group consisting of diethylene glycol monobutyl ether acetate, diethyl phthalate, isoamyl salicylate, and diethylene glycol hexyl ether.

3. A liquid carrier vehicle in accordance with claim 2 wherein said volatile organic liquid solvent is about 90 – 80 weight percent and said organic binder is about 10 – 20 weight percent.

4. A liquid carrier vehicle for use in a microelectronic printing paste said vehicle consisting of about 90 – 80 weight percent of a polypropylene glycol having an average molecular weight less than about 500 as a volatile organic liquid solvent, about 10 – 20 weight percent of an organic binder selected from the group consisting of N-4 to N-200 ethyl cellulose, and about 0 – 98 weight percent of diethylene glycol monobutyl ether acetate.

5. A liquid carrier vehicle according to claim 4 in which the organic binder is about 15 weight percent.

6. A printing paste for microelectronic circuitry consisting essentially of:

a. about 35 – 10 weight percent of the liquid carrier vehicle of claim 2, and b. about 65 – 95 weight percent of a particulate solids component having an average particle size of about 10 – 0.3 microns and comprising about 10 – 20 weight percent of a lead borosilicate glass binder and about 90 – 80 weight percent of an electronically effective material selected from the group consisting of silver or silver-palladium in a weight ratio of Ag:Pd of about 0.5:1 – 4:1, said paste having a rest viscosity less than about 3,000,000 centipoise at 25°C, but greater than about 780,000 centipoise at 25°C.

7. A printing paste in accordance with claim 6 in which the particulate solids component (b) comprises about 90 – 80 weight percent of the electronically effective material and about 10 – 20 weight percent of the glass binder, which glass binder comprises about 75 weight percent of the lead borosilicate glass and about 25 weight percent particulate $Bi_2O_3$.

8. A printing paste for microelectronic circuitry consisting essentially of:

a. about 35 – 10 weight percent of the liquid carrier vehicle of claim 4, and b. about 65 – 95 weight percent of a particulate solids component having an average particle size of about 10 – 0.3 microns and comprising about 10 – 20 weight percent of a lead borosilicate glass and about 90 – 80 weight percent of an electronically effective material selected from the group consisting of silver or silver-palladium in a weight ratio of Ag:Pd of about 0.5:1 – 4:1, said paste having a rest viscosity less than about 3,000,000 centipoise at 25°C. but greater than about 780,000 centipoise at 25°C.

9. A printing paste in accordance with claim 8 in which the lead borosilicate glass comprises in weight percent about:

| | |
|---|---|
| PbO | 60 |
| $B_2O_3$ | 16 |
| $SiO_2$ | 17.6 |
| $Al_2O_3$ | 3.1 |
| CdO | 5.9. |

10. A printing paste in accordance with claim 8 in which the lead borosilicate glass comprises in weight percent about:

| | |
|---|---|
| PbO | 71.5 |
| $B_2O_3$ | 9.5 |
| $SiO_2$ | 2.5 |
| ZnO | 15 |
| CaO | 0.5 |
| BaO | 0.5 |
| SnO | 0.5. |

* * * * *